(12) United States Patent
Boeve

(10) Patent No.: US 7,355,882 B2
(45) Date of Patent: Apr. 8, 2008

(54) METHOD AND DEVICE FOR PERFORMING ACTIVE FIELD COMPENSATION DURING PROGRAMMING OF A MAGNETORESISTIVE MEMORY DEVICE

(75) Inventor: Hans Marc Bert Boeve, Eindhoven (NL)

(73) Assignee: NXP B.V., Eindhoven (NL)

( * ) Notice: Subject to any disclaimer, the term of this patent is extended or adjusted under 35 U.S.C. 154(b) by 25 days.

(21) Appl. No.: 10/579,933

(22) PCT Filed: Nov. 17, 2004

(86) PCT No.: PCT/IB2004/052467

§ 371 (c)(1),
(2), (4) Date: May 19, 2006

(87) PCT Pub. No.: WO2005/050660

PCT Pub. Date: Jun. 2, 2005

(65) Prior Publication Data

US 2007/0070686 A1    Mar. 29, 2007

(30) Foreign Application Priority Data

Nov. 24, 2003    (EP)    ................................. 03104338

(51) Int. Cl.
*G11C 11/00* (2006.01)
(52) U.S. Cl. ........................ 365/158; 365/145; 365/171
(58) Field of Classification Search ................ 365/145, 365/171, 173, 158
See application file for complete search history.

(56) References Cited

U.S. PATENT DOCUMENTS 7,088,612 B2 *   8/2006   Braun et al. ................. 365/173
7,227,774 B2 *   6/2007   Tuttle et al. ................ 365/158

* cited by examiner

*Primary Examiner*—Tuan T. Nguyen
*Assistant Examiner*—Hien Nguyen
(74) *Attorney, Agent, or Firm*—Peter Zawilski

(57) ABSTRACT

The present invention provides an array of magnetoresistive memory elements. The array includes means for applying a current or voltage for generating a programming magnetic field at a selected magnetoresistive memory element, a magnetic field sensor unit for measuring an external magnetic field in the vicinity of the selected magnetoresistive memory element, and means for tuning the current or voltage for compensating locally for the measured external magnetic field during a programming operation. The present invention also provides a corresponding method.

20 Claims, 4 Drawing Sheets

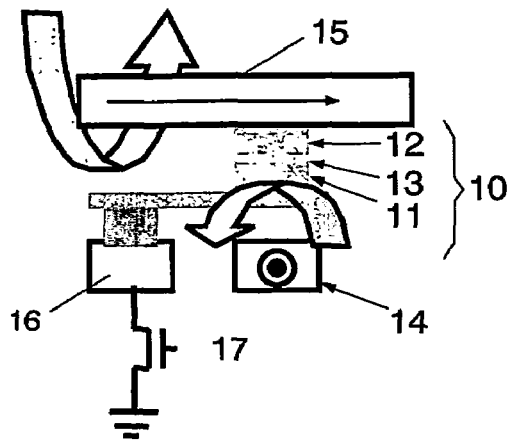
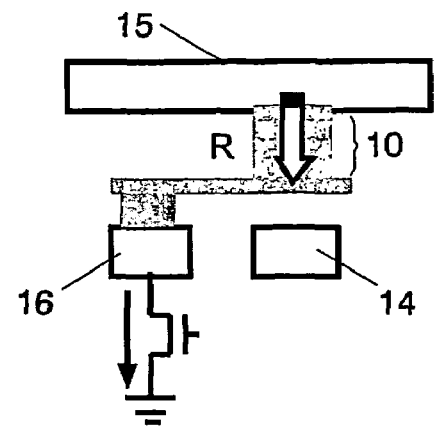
FIG.1A  FIG.1B
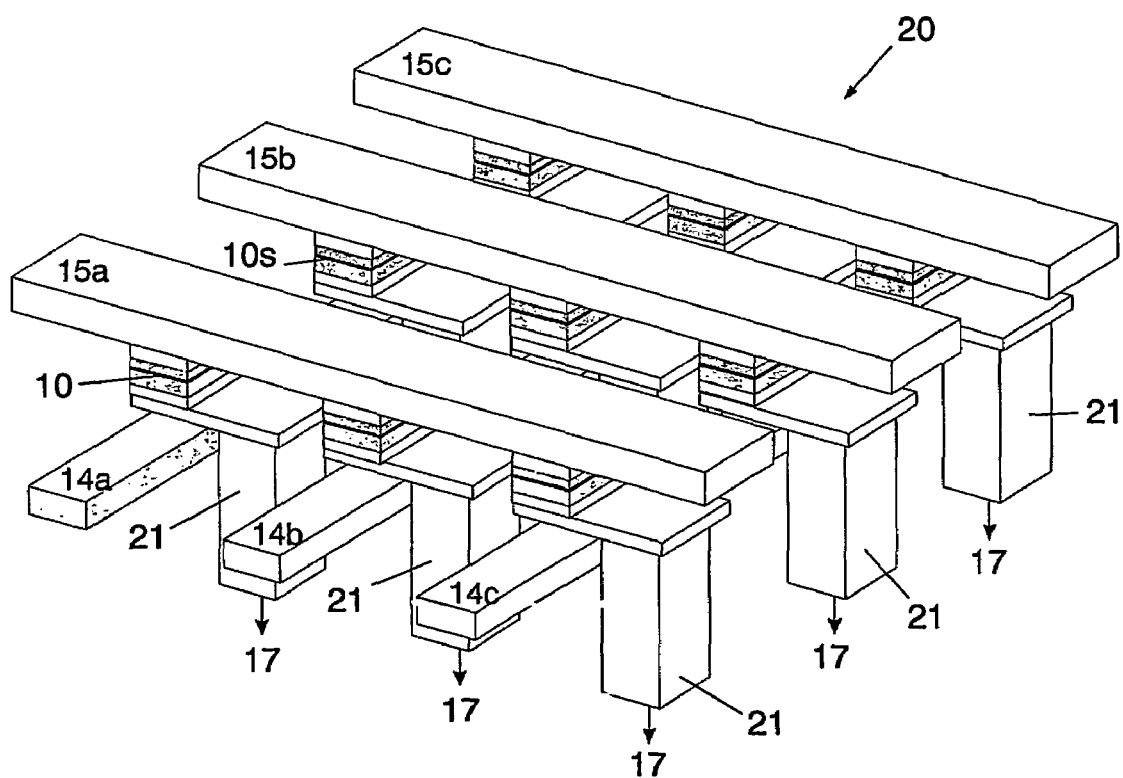
FIG.2

METHOD AND DEVICE FOR PERFORMING ACTIVE FIELD COMPENSATION DURING PROGRAMMING OF A MAGNETORESISTIVE MEMORY DEVICE

The present invention relates to a method and device for providing compensation for the presence of an external magnetic field during programming of a magnetoresistive memory device such as an MRAM device.

Magnetic or Magnetoresistive Random Access Memory (MRAM) is currently being considered by many companies as a successor to flash memory. It has the potential to replace all but the fastest static RAM (SRAM) memories. This makes MRAM very suitable as embedded memory for System on Chip (SoC). It is a non-volatile memory (NVM) device, which means that no power is required to sustain the stored information. This is seen as an advantage over most other types of memory. MRAM memories can be used in particular for 'mobile' applications, such as smartcards, mobile phones, PDA's, etc.

The MRAM concept was originally developed at Honeywell Corp. USA, and uses magnetisation direction in a magnetic multi-layer device as information storage and the resultant resistance difference for information readout. As with all memory devices, each memory element in an MRAM array must be able to store at least two binary states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR effect provide possibilities to realise a.o. non-volatile magnetic memories. These devices comprise a stack of thin films of which at least two are ferromagnetic or ferrimagnetic, and which are separated by a non-magnetic interlayer. GMR is the magneto-resistance for structures with conductor inter-layers and TMR is the magneto-resistance for structures with dielectric inter-layers. If a very thin conductor is placed between two ferromagnetic or ferrimagnetic films, then the effective in-plane resistance of the composite multi-layer structure is smallest when the magnetisation directions of the films are parallel and largest when the magnetisation directions of the films are anti-parallel. If a thin dielectric interlayer is placed between two ferromagnetic or ferrimagnetic films, tunneling current between the films is observed to be the largest (or thus resistance to be the smallest) when the magnetisation directions of the films are parallel and tunneling current between the films is the smallest (or thus resistance the largest) when the magnetisation directions of the films are anti-parallel.

Magneto-resistance is usually measured as the percentage increase in resistance of the above structures going from parallel to anti-parallel magnetisation states. TMR devices provide higher percentage magneto-resistance than GMR structures, and thus have the potential for higher signals and higher speed. Recent results indicate tunneling giving over 40% magneto-resistance, compared to 10-14% magneto-resistance in good GMR memory elements.

A typical MRAM device comprises a plurality of magnetoresistive memory elements 10 of which one is illustrated in FIGS. 1A and 1B, e.g. magnetic tunneling junction (MTJ) elements, arranged in an array. An array 20 of magnetoresistive memory elements 10 is illustrated in FIG. 2. MTJ memory elements 10 generally include a layered structure comprising a fixed or pinned hard magnetic layer 11, a free layer 12 and a dielectric barrier 13 in between. The pinned layer 11 of magnetic material has a magnetic vector that always points in the same direction. The free layer 12 is used for information storage. The magnetic vector of the free layer 12 is free, but constrained within the easy axis of the free layer 12, which is determined chiefly by the physical dimensions of the memory element 10. The magnetic vector of the free layer 12 points in either of two directions: parallel or anti-parallel with the magnetisation direction of the pinned layer 11, which coincides with the said easy axis. The fundamental principle of MRAM is the storage of information as binary data, e.g. as "0" and "1", based on directions of magnetisation. This is why the magnetic data is non-volatile and will not change until it is affected by a magnetic field.

Storing or writing data into a magnetoresistive memory element 10 is accomplished by applying magnetic fields and thereby causing magnetic material in the free layer 12 to be magnetised into either of two possible memory states. When both magnetic films 11, 12 of the layered structure of an MRAM-element 10 are magnetised with the same orientation (parallel), the data is either of two binary values, e.g. "0", otherwise, if both magnetic films 11, 12 of the layered structure of the MRAM-element 10 are magnetised with inverse orientation (anti-parallel), the data is the other binary value, e.g. "1". The magnetic fields are created by passing currents through current lines (word lines 14, 14a, 14b, 14c and bit lines 15, 15a, 15b, 15c) external to the magnetic structures. It is to be noted that two magnetic field components are used to differentiate between a selected memory element 10s and other non-selected memory elements 10.

Reading data is accomplished by sensing resistance changes in a magnetic memory element 10 when magnetic fields are applied. Making use of the fact that the resistance of the layered structure 11, 12, 13 varies depending on whether or not the orientations are parallel, the system can discriminate both binary values of the data, e.g. "0" or "1". The magnetic fields required for readout are created by passing currents through current lines (word lines) external to the magnetic structures, or through the magnetic structures themselves (via bit line 15 and sense lines 16). Reading of a selected memory element 10s is done through a series transistor 17 connected to a via 21 to avoid sneak currents through other memory elements 10.

The most common MRAM design is the type 1T1MTJ (1 transistor 17 per 1 MTJ memory element 10), as illustrated in FIGS. 1A and 1B. A memory array 20 comprising a plurality of memory elements 10 comprises orthogonal bit lines 15a, 15b, 15c and word lines 14a, 14b, 14c patterned separately into two metal layers respectively under and above the magnetic tunnel junction (MTJ) memory elements 10. The bit lines 15a, 15b, 15c are parallel with the hard axis of the memory elements 10, which creates a field in the easy axis, while the word lines 14a, 14b, 14c otherwise create a field in the hard axis. In some designs the relations can be reversed, i.e. the bit lines 15 may create a hard axis field and the word lines 14 may create an easy axis field. Writing on a selected memory element 10s is done by simultaneously applying current pulses through the respective bit line 15b and word line 14a that intersect at the selected memory element 10s. The direction of the resultant field makes an angle of 45° with respect to the easy axis of the free layer 12 of the memory element 10s. At this angle, the switching field of the free layer 12 is the smallest, thus writing can be done with the least current.

The switching curve of an MRAM element can be represented by its so-called astroid curve 30, 31 as shown in FIG. 3. The astroid curves 30, 31 unambiguously separate switching and non-switching events for different time periods. In MRAM arrays, statistical variations between memory elements, e.g. variations in size, will lead to statistical variations in the magnetic switching field, hence in the exact size of the astroids. Astroid curve 30 is a curve illustrating 10 year stability for non-selected memory elements 10, and astroid curve 31 is a curve illustrating the required magnetic field for a 10 ns pulse write operation for a selected memory element 10s. In other words, if a magnetic field is being applied within the astroid curve 30, 31, elements will not switch and maintain in their state for 10 years, respectively 10 ns, whereas fields exceeding these astroids may switch the element during the corresponding time frames, if the previous state were the opposite one. Therefore, only if two magnetic field components are present, the bit state of a selected memory element 10s can be switched without altering non-selected memory elements 10.

If the magnitudes of the magnetic fields generated by either current line 14, 15 are the same, the direction of the resultant magnetic field makes an angle of 45° with respect to the easy axis of the free layer 12 of the selected memory element 10s. At this angle, the switching field of the free layer 12 is the smallest, as shown by the astroid curve 30, 31 in FIG. 3, thus writing can be done with the least current.

On the one hand, the currents in the selected bit line 15b and word line 14a must be chosen in such a way that the total magnetic field sufficiently exceeds the switching field of the selected memory element 10s at 45° with the easy axis, or in other words, so that the end of the resultant field vector 32 is on or outside the astroid curve 31 in this direction (see FIG. 3). On the other hand, the magnitude of the field created by the selected bit line 15b must be significantly smaller than the switching fields in the easy axis direction EA of any of the memory elements 10 lying on the same bit line 15b to prevent undesired over-writing. Also, the magnitude of the field created by the selected word line 14a must be significantly smaller than the switching fields in the hard axis direction HA of any of the memory elements 10 lying on the same word line 14a to prevent undesired over-writing. In other words, for stability of other elements on one of the selected lines, both components must be lying within the astroid 30.

FIG. 3 also illustrates stable on-chip write field windows 33, not taking into account statistical variations between memory elements, i.e. if a resultant magnetic field vector, obtained by applying a first current through a selected bit line and a second current through a selected word line, falls within such on-chip write field window 33, it will switch the magnetic state of the selected memory element 10s if the previous state were the opposite one, but non-selected memory elements 10 located along one of the selected word or bit lines will not switch states.

It is a disadvantage of MRAM elements that an intentional or unintentional exposure to strong magnetic fields makes them vulnerable. Very high density MRAM arrays 20 are particularly sensitive to magnetic fields mainly because the minuscule MRAM elements 10 require relatively low magnetic fields for read/write operations which depend upon the switching or sensing of magnetic vectors in the free layers 12. These magnetic vectors are, in turn, easily affected and may have their magnetic orientation changed by such external magnetic fields.

If an extra external magnetic field were present during a write operation, the write field window should be adapted. As a simple example: if a small external field of only 10 Oe along the easy axis field components would be present, the current should be reduced/increased in such a manner that, for a selected memory element 10s, a smaller/larger field is generated in the appropriate current line for writing a '0' or a '1'. In FIG. 3 the 'zero-external magnetic field reference' (along the easy axis in this example) would be shifted with 10 Oe with respect to the origin. In a more general case, any in-plane external field results in a shift of the astroid curve from the origin, as its vectorial sum with the 2-D field vector.

A solution would be to shield the memory elements from any external field. However, also shielding has its limits so that, always, a higher magnetic field can be applied which will cause an external magnetic field in the vicinity of the data layer.

It is therefore an object of the present invention to provide a method and a device in which the level of shielding of external magnetic fields during writing or programming of a magnetoresistive element can be reduced.

The above objective is accomplished by a method and device according to the present invention.

In one aspect, the present invention provides an array of magnetoresistive memory elements. The array comprises:

means for applying a current or a voltage for generating a programming magnetic field at a selected magnetoresistive memory element, a magnetic field sensor unit for measuring an external magnetic field in the vicinity of the selected magnetoresistive memory element, and means for tuning the current or voltage for compensating locally for the measured external magnetic field during a programming operation.

It is an advantage of the present invention that, by tuning the current or voltage for compensating locally for the measured external magnetic field, the level of shielding can be reduced for certain magnetoresistive applications.

The magnetic field sensor unit preferably is an analog sensor unit. The analog magnetic field sensor unit may be an element of the same construction as the magnetoresistive memory elements. This makes it easy to implement in an array of magnetoresistive elements, thus obtaining a monolithic integration. No separate masks are needed then to manufacture the magnetic field sensor unit.

The magnetic field sensor unit may comprise one or more magnetic field sensors. A multitude of magnetic field sensors may be included, as an example, with a first sensor to measure an x-component, and a second sensor for measuring an y-component of the external magnetic field.

The means for applying a current or voltage may comprise at least one current line and means for flowing current through the at least one current line.

The magnetic field sensor unit may be adapted to generate an output signal representative of the external magnetic field measured.

The means for tuning the current or voltage may comprise a compensation circuit for imposing a compensation current to flow through the at least one current line. The at least one current line may include a structure having two orthogonal sets of current lines carrying both the write currents needed for applying the typical write fields, as well as the compensation currents. Alternatively extra current lines in one or both directions may be added for at least one of the compensation currents, so that these compensation currents do not flow through the current lines used for generating the magnetic write fields for the memory elements. This may not be an ideal situation, and is only relevant if current in the current lines would be limited e.g. due to electromigration.

The compensation circuit may also impose a compensation magnetic field at the magnetic field sensor unit. If the geometry of the sensor(s) with respect to the current lines resembles that of the memory elements, the compensation magnetic field imposed at the magnetic field sensor unit may be imposed in the same way to the memory elements. For example if the compensation magnetic field is imposed by flowing current through current lines, the same which is fed to current lines so as to generate a magnetic field influencing the sensor(s), can be fed to the current lines of the array so as to generate compensating magnetic fields in the array.

The magnetic field sensor unit may be more sensitive to magnetic fields than the magnetoresistive memory elements.

In a second aspect, the present invention provides a method for compensating for the presence of an external magnetic field during programming of a magnetic memory element, the programming being performed by applying a current or voltage for generating a programming magnetic field to the magnetic memory element. The method comprises:

measuring the external magnetic field in the vicinity of the magnetic memory element, and locally compensating for the external magnetic field during the programming operation by tuning the current or voltage for generating the programming magnetic field.

Applying a current or voltage may comprise flowing a current through at least one current line. Tuning the current or voltage may comprise flowing a current through the at least one current line, which current is different from the current which would flow through the at least one current line when no external magnetic field would be present in order to generate a same programming magnetic field.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 1A illustrates the MRAM write principle and FIG. 1B illustrates the MRAM read principle.

FIG. 2 is a perspective view of a known 1T1MTJ MRAM design comprising a plurality of memory elements and perpendicular bit lines and word lines. Magnetic tunnel junctions (MTJ) are placed at the intersection regions of the bit lines and word lines. The bottom electrodes of the MTJs are connected to selection transistors with vias, which are used when reading the memory elements.

Figure 5:
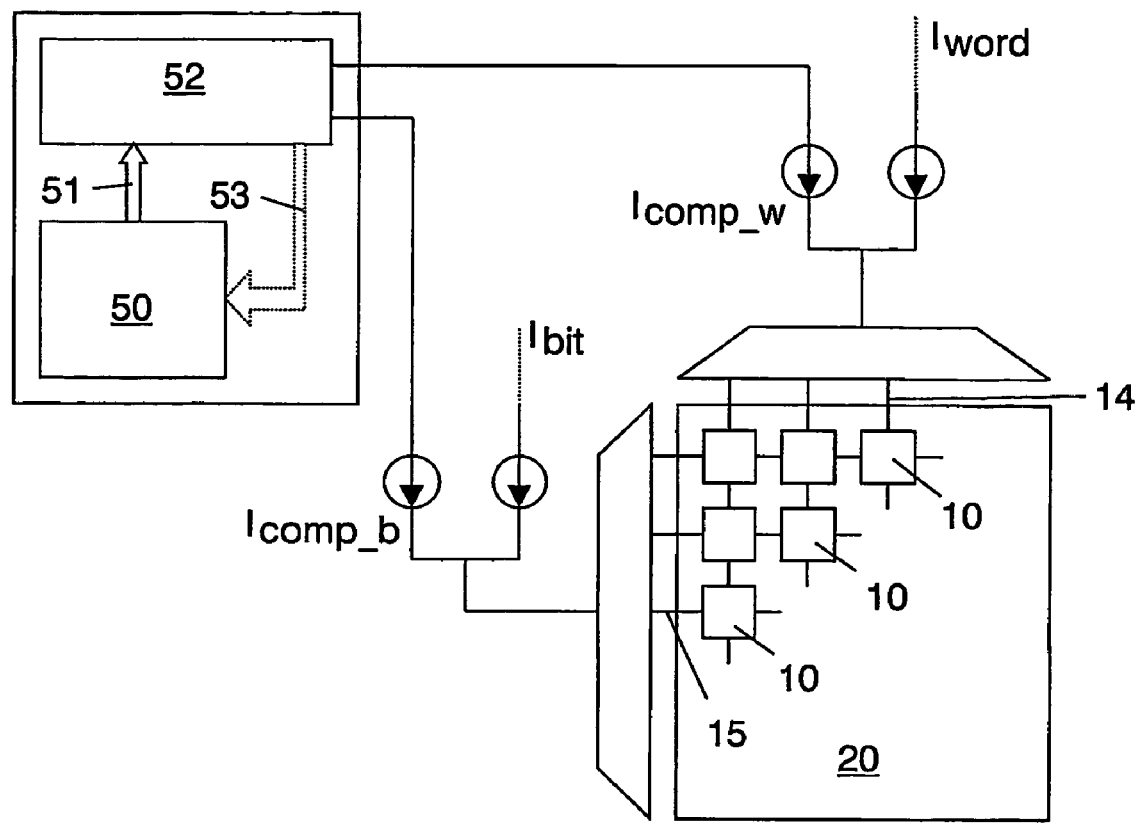

FIG. 5 schematically illustrates a system for current tuning according to an embodiment of the present invention. Input from a magnetic field sensor is used in a compensation field circuit, which effectively may be a zero-field feedback system generating compensation current curves.

Figure 6A:
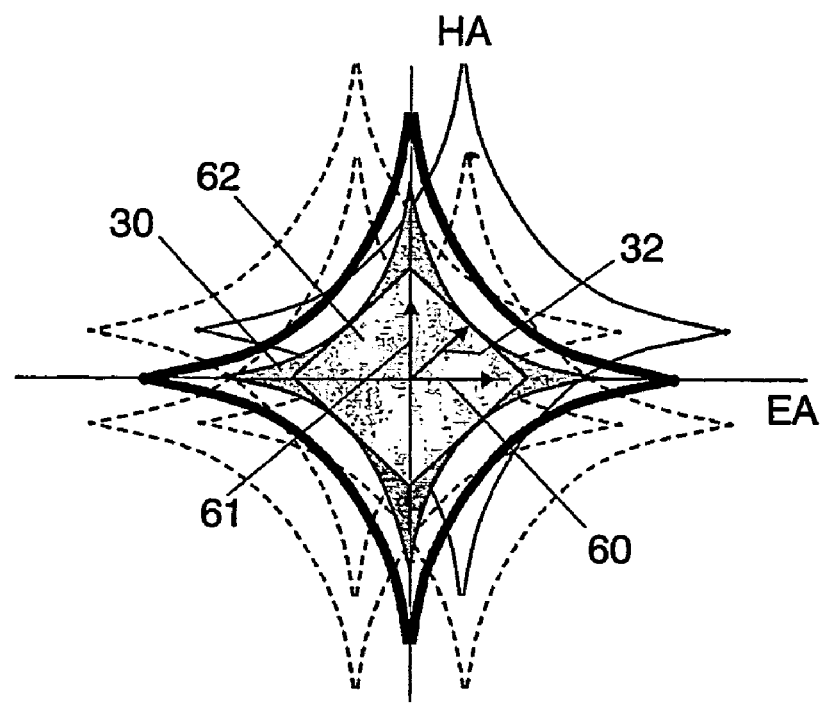
Figure 6B:
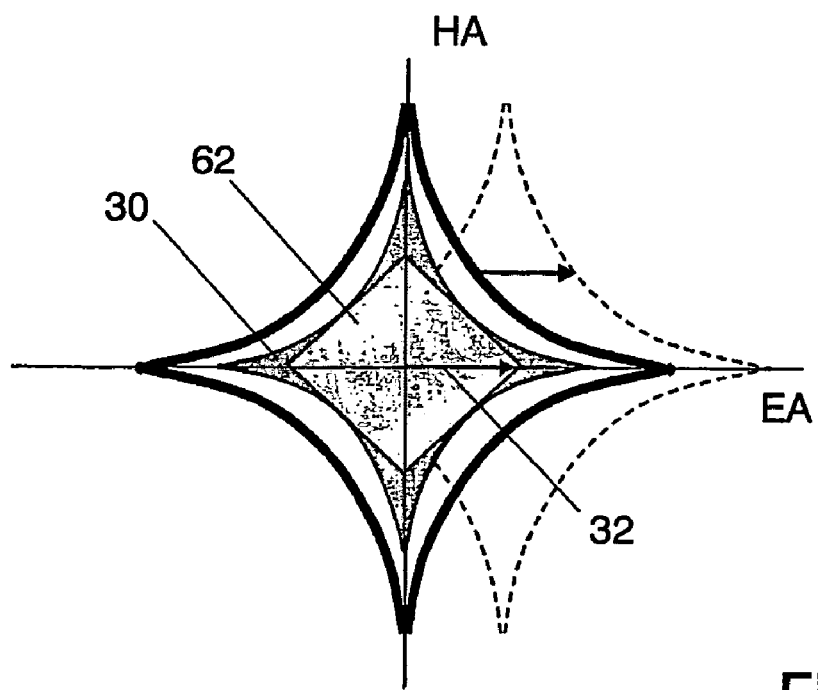

FIGS. 6A and 6B show diagrammatic representations of fields that can be compensated for.

In the different drawings, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The present invention provides local active field compensation during a write operation on a selected magnetoresistive memory element 10s in a magnetic memory array 20. According to the present invention, a magnetic field sensor 50 or sensor unit is added to the MRAM array 20, and its output 51 is used to tune the current levels during a write operation to be able to compensate for potential external magnetic fields. This way, the current levels used during a write operation follow the stable write field regions that shift with the external magnetic field.

Figure 4:
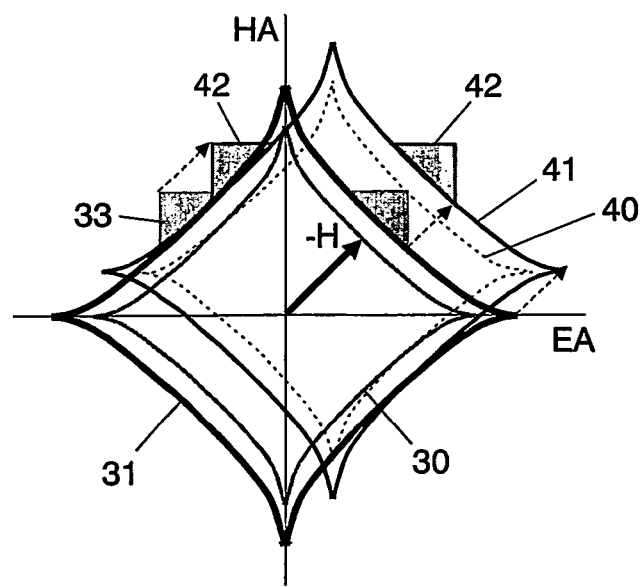
FIG. 4 illustrates the shift of the astroid curve and write field windows (triangles) due to an external field H.

FIG. 4 illustrates the effect of an external magnetic field on the astroid switching curves 30, 31 of a typical magnetic memory element 10. Astroid curves 30, 31 are the ones for a memory element 10 if no external magnetic field is present Under the influence of a magnetic field H, in the example given at 45 degrees with respect to the easy axis, astroid curves 30, 31 shift towards astroid curves 40, 41 in a direction opposite to the direction of the external magnetic field H. Also the stable on-chip write field windows 33 shift in the same direction towards stable on-chip write field windows 42. The term "on-chip write field window" is used here and later on in the description and the claims to discriminate between the externally applied magnetic field and the magnetic field that is generated on-chip during the write operation. The term is used to point out that one deals with the magnetic field that is generated by on-chip currents, e.g. flowing through word lines and bit lines. It is to be noted that on all astroid curves shown, the axes show either on-chip write fields along the easy axis EA and the hard axis HA, or currents that generate the EA and HA fields. This is different from the total magnetic field present, which is the sum of the externally applied magnetic field and the on-chip generated magnetic field.

According to an aspect of the present invention, a magnetic field sensor 50 is provided to measure a magnetic field in the neighbourhood of the memory array 20. The magnetic field is preferably a magnetic field local, adjacent or near to the memory array. It is to be noted that for active field compensation an analog sensor is preferred. The magnetic field in the vicinity of the memory array 20 can be measured in various ways, either directly or indirectly.

The magnetic field sensor 50 can be any type of magnetic sensor which may be added to the circuit comprising magnetoresistive memory elements 10, e.g. to an MRAM IC. Preferably, the magnetic field sensor 50 is integrated into magnetoresistive memory array 20. The magnetic field sensor 50 can be, for example, a Hall sensor, which is a solid state semiconductor sensor which senses magnetic field strength and produces a voltage that changes with this strength.

However, in case of the magnetoresistive memory array 20 comprising MRAM elements 10, it is advantageous to use as magnetic field sensor 50 a magnetic tunnel junction with the same stack composition as the MRAM elements 10 in the array 20. Further, the MRAM elements 10 themselves, or additional MRAM elements which are not used as memory elements could serve as magnetic field sensors 50 to monitor the local external disturbing field.

Because of the bistable magnetisation configuration of MRAM elements, they are not particularly sensitive to small fields. As soon as they are significantly influenced by a field, there is a risk that also MRAM elements containing data are already affected by the disturbing field. Therefore, it is desirable to use a magnetic field sensor 50 that is more sensitive to magnetic field strength than the MRAM elements 10 of the memory array 20 themselves. Preferably, the sensor comprises the same material stack as used in the MRAM elements. The tuning of the sensor so that it is more sensitive to magnetic fields can be achieved by e.g. using a different shape of the magnetic element. For example, a lower aspect ratio means that the device is more sensitive, or a larger size using a different orientation also means that it is more sensitive. In an embodiment of the present invention, one or more MRAM elements to be used as sensors are rotated over an angle, e.g. 90 degrees with respect to the normal MRAM elements 10 in the memory array 20, while the direction of the magnetisation of the pinned layer 11, which is usually determined by exchange biasing, is the same. In this so-called crossed-anisotropy geometry the shape anisotropy causes that the direction of the free layer 12 will make an angle of 90 degrees with the direction of the pinned layer 11, which is the most sensitive point on the working curve of the magnetic tunnel junction.

Different types of integrating the sensor with the MRAM chip can be thought of, and are to some extend described hereinafter:

(1) A first approach is, as described above, to integrate the sensor on the MRAM chip—a monolithic integration. Hence, the sensor will be very close to the memory array, and can possibly be included somehow in the memory array itself. The sensor can also be placed at a corner of the chip.

(2) A second approach is what is called the hybrid way. The sensor is no longer on the MRAM chip itself, or better the piece of substrate, for example silicon, on which the MRAM is located, e.g. embedded MRAM (e-MRAM) within a larger system, or SoC (system-on-chip). Due to high cost of implementing different functionality, in particular in the sensor area, there is a trend to 'horizontal' integration, or system-in-package, where different dies are combined into a single package. The proposal here would be to combine two chips in one single package, i.e. a first chip comprising the MRAM device and a second chip, on which the magnetic sensor(s) is/are located.

(3) A last approach would be two simply use two different chips that are also separately packaged. One of the reasons for doing so could be the fact that a MRAM chip requires a high level of shielding, which is not required for the sensor. One or more extra pins on the MRAM chip are then needed to feed in the sensor signal.

In all of the above integration types, the magnetic field sensor output 51 is used as a direct signal representative of the local, external magnetic field. For a reliable write operation, the external magnetic field is to be locally compensated for during a write operation. For example, the currents used during a write operation can be tuned when an external magnetic field is present.

The present invention provides a compensation field circuit 52, which tunes current based on the magnetic field sensor output 51, especially the analog sensor output. It is to be noted that the magnetic field sensor(s) 50 or sensor unit(s) preferably provide a 2D representation of the magnetic field in the vicinity of the MRAM array 20. The distance between the magnetic field sensor(s) 50 and the array is so that the field that is present in the MRAM array is measured. Since there will mostly be dealt with the far magnetic field, length scales are moderate. Depending on the level of integration, as explained above, different distances may be used. In an on-chip implementation, the magnetic field sensor 50 is preferably as close as possible to the MRAM array, or when unshielded up to a distance of 1 cm. For a hybrid implementation in a single package, the distance will be in the order of 1 cm, and for different packages, it would be clever to place the sensor and the MRAM close together, e.g. next to one another, or the sensor on top of the MRAM chip.

The 2D representation is preferably quantitative. The effect of the external magnetic field on the astroid curve, as well as the required write field windows are depicted in FIG. 4 for, as an example only, a negative external magnetic field being applied along the 45 degree direction. As a matter of fact, other currents have to be applied to the word lines 14 and bit lines 15 in order to manipulate the data bits. The current levels are tuned in such a way that the required on-chip write field window 42 for write operation is shifted along with the measured external field, as shown in FIG. 4.

In a first embodiment of the present invention, the magnetic field sensor output 51 is directly used as input to a compensation field circuit 52 which functions to generate the compensation currents for the bit and word field ($I_{comp\_b}$ and $I_{comp\_w}$, respectively), i.e. easy and hard axis field, as shown in FIG. 5. As shown two currents are generated. The compensation field circuit 52 reads the output 51 (analog—voltage or current) of the magnetic field sensor unit that may comprise one or more magnetic field sensors 50. As an example, two sensors, or sensor bridges, can be used to measure the two field components separately. The magnetic field sensor output(s) 51 are then translated by the compensation field circuit 52 into the required compensation currents. The compensation field circuit 52 comprises an analog amplification circuit, either a voltage-to-current, or a current-to-current transducer. The compensation field circuit 52 can also be made such that it is able to compensate for temperature variations that may affect the output of the magnetic field sensor 50, but may also influence the required currents needed during a write operation. Hence a two-fold algorithm for temperature compensation can be included combining temperature effects on (1) the switching of the magnetic memory elements and on (2) the sensor output. The compensation field circuit 52 needs to be calibrated along with the magnetic field sensor 50 during testing of the MRAM chips.

The current sources $I_{comp\_b}$ and $I_{comp\_w}$ may be bipolar, and are ideally able to correct for any external field or for a range of likely external fields. The effective field range will depend on the particular MRAM design, and the geometry and size of its elements. An example is given below.

It is to be noted, however, that for certain external magnetic fields being present, the current needed for writing may in certain cases nearly double, which may have its implications on the highest current levels possible in the memory architecture, e.g. with respect to the electromigration limit. Moreover, compensation for fields exceeding a top level value is in principle possible for a selected memory element 10s, but not realistic as retention of other memory elements can no longer be guaranteed. For too small fields, one may decide not to apply any current tuning, as the external fields falls within the write field margins. For present state-of-the-art MRAM, fields of a few Oe, e.g. 3 to 5 Oe, would not harm MRAM write operations, hence do not need to be compensated for.

Hereinafter, an example is included of all fields that are felt without and with compensation. It is needed to discriminate between three sorts of memory elements:

(1) the selected memory element 10s, on which the write operation should have its desired effect (=switching), (2) non-selected memory elements 10 that share one of the current lines of the selected memory elements 10s, and that are exposed to half-selects, and (3) the other non-selected memory elements 10.

The different requirements for data retention and reliable writing are as follows: the selected memory element 10s has to be switched within 10 ns, and the non-selected memory elements have to have 10 years stability even when exposed to half-selects. Also the non-selected memory elements have to have 10 years data retention as well (without half-select fields being present).

Figure 3:
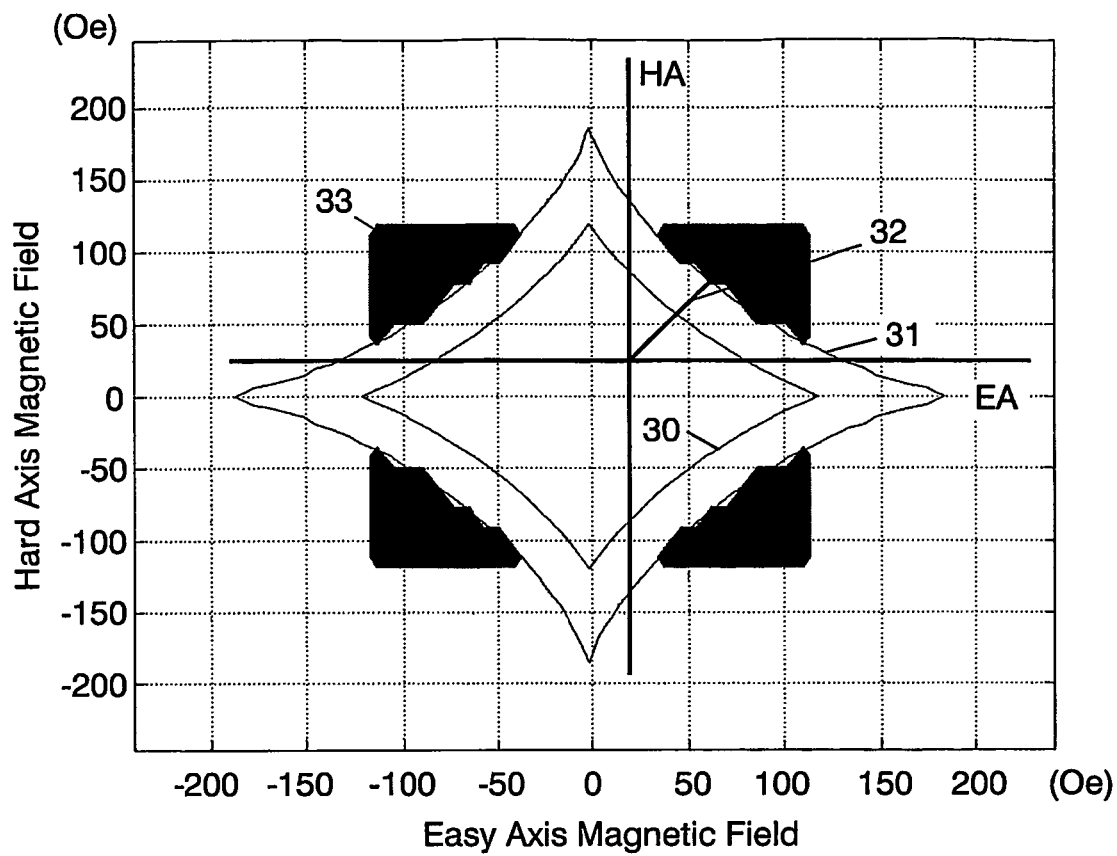
FIG. 3 illustrates an astroid curve showing criteria for robust write operation in MRAM, resulting in stable write field windows.

When no magnetic field compensation is performed, the different memory elements 10 will sense the following fields. It is to be noted that the write field is labeled $H_W$ ($H_{Wx}$, $H_{Wy}$) and the external disturbing field $\Delta H$ ($\Delta H_x$, $\Delta H_y$). The selected memory element 10s is exposed to the total field ($H_{Wx}+\Delta H_x$, $H_{Wy}+\Delta H_y$), non-selected memory elements 10 that share one of the current lines of the selected memory element 10s are exposed to either ($H_{Wx}+\Delta H_x$, $\Delta H_y$), or ($\Delta H_x$, $H_{Wy}+\Delta H_y$), and other non-selected memory elements 10 are exposed to ($\Delta H_x$, $\Delta H_y$). In other words, as long as the external disturbing field is sufficiently small, e.g. less than 5 Oe in any direction, the write operation on the selected memory element 10s will remain successful (still within the write field windows 33 in FIG. 3 and FIG. 4). The stability of non-selected memory elements 10 that share one of the current lines with the selected memory element 10s will be less, but when the field is not constantly present, the stability will most likely be sufficient to guarantee data retention. If the external field $\Delta H$ would be present continuously in a certain application, e.g. due to proximity to a wire carrying a substantial dc current, different measures may be taken in the form of an initial calibration of write current ('constant' compensation current as function of time), or by re-design of the memory element itself, to compensate for the asymmetry caused by the external field. Data retention of other non-selected memory elements 10 is not an issue, since stability is guaranteed up to higher fields (inner astroid curve 30 in FIG. 3).

When compensation for the external magnetic field $\Delta H$ is applied, according to the present invention, then the currents in the current lines are tuned such that the selected memory element 10s is exposed to $H_W$ ($H_{Wx}$, $H_{Wy}$), therefore the compensation currents $I_{comp\_b}$ and $I_{comp\_w}$ generate a magnetic field $H_C$ ($H_{Cx}$, $H_{Cy}$) at the position of the selected memory element 10s that is equal to $-\Delta H$. The total vectorial sum of fields to which the selected memory element 10s is exposed is ($H_{Wx}+\Delta H_x+H_{Cx}$, $H_{Wy}+\Delta H_y+H_{Cy}$). As a consequence, non-selected memory elements 10 which share a current line with the selected memory element 10s are exposed to either ($H_{Wx}+\Delta H_x+H_{Cx}$, $\Delta H_y$)=($H_{Wx}$, $\Delta H_y$), or ($\Delta H_x$, $H_{Wy}+\Delta H_y+H_{Cy}$)=($\Delta H_x$, $H_{Wy}$), and other non-selected memory elements remain to be exposed to ($\Delta H_x$, $\Delta H_y$). It is to be noted that the compensation is complete for the selected memory element 10s, but for non-selected memory elements 10 that share a current line with the selected memory element 10s only one of the field components is compensated, and for other non-selected memory elements 10 no compensation takes place. The compensation scheme is then limited to the stability requirement for non-selected memory elements 10 that share a current line with the selected memory element 10s, and other non-selected memory elements 10, but also to the maximum currents that can be generated in the current lines to the memory array. Due to electromigration, the maximum compensation current will be limited. It is to be noted that if total currents would be limited due to electromigration, extra (sets of) current lines can be added in a different plane. Due to cost of extra masks, this is not ideal but possible.

In the geometrical constructions in FIGS. 6A and 6B, the magnetic fields that qualify for the stability requirement for non-selected memory elements 10 that share a current line with the selected memory element 10s are depicted. The arrow 32 represents the required write field for the selected memory element 10s, which is compensated for the external field. Stability for non-selected memory elements 10 that share a current line with the selected memory element 10s is guaranteed as long as ($H_{Wx}$, $\Delta H_y$), or ($\Delta H_x$, $H_{Wy}$), is located within the 10-year stability region (astroid curve 30). In FIG. 6A, the write field indicated by the arrow 32 is decomposed into its two components 60, 61, and the maximum allowed range for the x and y components $\Delta H_x$ and $\Delta H_y$ of the external disturbing magnetic field is indicated by the square 62. All disturbing external magnetic fields ($\Delta H_x$, $\Delta H_y$) within the square 62 can be compensated for.

For most applications, the external disturbance fields ($\Delta H_x$, $\Delta H_y$) will be random, and for a short period of time only. Therefore, the square 62 in FIGS. 6A and 6B can be increased to larger fields, since the required time for stability for a 'higher' half-select field will be less in the case of 'rare events'. It is anticipated that fields up to some tens of Oe, e.g. up to 40 Oe, can be compensated for, typically up to about half the required magnetic field for writing (see geometrical constructions in FIGS. 6A and B). In other words, the write current range will vary due to the compensation part between 50% and 150% of the typical write current values, e.g. for a 8 mA current that would be required to generate one of the magnetic field components at zero external magnetic field, the total current including compensation can vary from approximately 4 mA up to 12 mA, depending on the direction and strength of the external magnetic field.

In a second embodiment, the magnetic field sensor output 51 can be part of a direct feedback loop 53 that is generating the required compensation currents, e.g. $I_{comp\_b}$, $I_{comp\_w}$ using magnetic field nulling along both the easy axis EA and hard axis HA. This active component forces the magnetic field sensor(s) 50 to remain in their zero-state by generating a magnetic field that compensates for the external magnetic field in the magnetic field sensor(s) 50. As for MRAM elements, magnetic field generation is done using current lines 14, 15 under and/or on top of the magnetic field sensor(s) 50. In one aspect the geometry of the sensor(s) resembles that of the memory elements 10, and compensation current is also fed directly into the MRAM array 20. In FIG. 5, this is schematically depicted by the dashed feedback loop 53. The embodiment can be integrated as a continuous feedback loop (in time).

It is to be noted that this second embodiment only deals with the sensor which has an internal feedback loop. The current in the feedback loop can be 'mirrored' onto the current needed by the compensation circuitry 52, e.g. by making sure that the field generation in the feedback loop is identical to the magnetic field generation in the memory array 20. Hence the position of sensor and memory elements with respect to the current lines, as well as the geometry of the corresponding current lines, is preferably identical.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An array of magnetoresistive memory elements comprising:
   a source to apply a current or a voltage for generating a programming magnetic field at a selected magnetoresistive memory element,
   a magnetic field sensor unit for measuring an external magnetic field in the vicinity of the selected magnetoresistive memory element, and
   a compensation circuit to tune the current or voltage for compensating locally for the measured external magnetic field during a programming operation.

2. The array according to claim 1, wherein the magnetic field sensor unit is an analog sensor unit.

3. The array according to claim 2, wherein the magnetic field sensor unit is more sensitive to magnetic fields than the magnetoresistive memory elements.

4. The array according to claim 1, wherein the magnetic field sensor unit comprises a plurality of magnetic field sensors.

5. The array according to claim 1, wherein the a source to apply a current or a voltage comprises at least one current line and sources for flowing current ($I_{bit}$, $I_{word}$) through the at least one current line.

6. The array according to claim 5, wherein a compensation circuit to tune the current or voltage comprises a compensation circuit for imposing a compensation current ($I_{comp\_b}$, $I_{comp\_w}$) to flow through the at least one current line.

7. The array according to claim 6, wherein the compensation circuit also imposes a compensation magnetic field at the magnetic field sensor unit.

8. The array according to claim 1, wherein the magnetic field sensor unit is adapted to generate an output signal representative of the external magnetic field measured.

9. The array according to claim 1, wherein the analog magnetic field sensor unit is an element of the same construction as the magnetoresistive memory elements.

10. An array of magnetoresistive memory elements comprising:
    means for applying a current or a voltage for generating a programming magnetic field at a selected magnetoresistive memory element,
    a magnetic field sensor unit for measuring an external magnetic field in the vicinity of the selected magnetoresistive memory element, and
    means for tuning the current or voltage for compensating locally for the measured external magnetic field during a programming operation; and
    wherein the magnetic field sensor unit is an analog sensor unit.

11. The array according to claim 10, wherein the magnetic field sensor unit comprises a plurality of magnetic field sensors.

12. The array according to claim 10, wherein the means for applying the current or voltage comprise at least one current line and means for flowing current ($I_{bit}$, $I_{word}$) through the at least current line.

13. An array according to claim 12, wherein the means for tuning the current or voltage comprises a compensation circuit for imposing a compensation current ($I_{comp\_b}$, $I_{comp\_w}$) to flow through the at least one current line.

14. An array according to claim 13, wherein the compensation circuit also imposes a compensation magnetic field at the magnetic field sensor unit.

15. The array according to claim 10, wherein the magnetic field sensor unit is adapted to generate an output signal representative of the external magnetic field measured.

16. An array according to claim 10, wherein the analog magnetic field sensor unit is an element of the same construction as the magnetoresistive memory elements.

17. An array according to claim 16, wherein the magnetic field sensor unit is more sensitive to magnetic fields than the magnetoresistive memory elements.

18. Method for compensating for the presence of an external magnetic field during programming of a magnetic memory element, the programming being performed by applying an current ($I_{bit}$, $I_{word}$) or a voltage for generating a programming magnetic field to the magnetic memory element, the method comprising:
    measuring the external magnetic field in the vicinity of the magnetic memory element, and
    locally compensating for the external magnetic field during the programming operation by tuning the current ($I_{bit}$, $I_{word}$) or voltage for generating the programming magnetic field.

19. Method for compensating for the presence of an external magnetic feld during programming of a magnetic memory element, the programming being performed by applying an current ($I_{bit}$, $I_{word}$)) or a voltage for generating a programming magnetic field to the magnetic memory dement, the method comprising:
    measuring the external magnetic field in the vicinity of the magnetic memory element, and
    locally compensating for the external magnetic field during the programming operation by tuning the current ($I_{bit}$, $I_{word}$) or voltage for generating the programming
    wherein applying a current of a voltage comprises flowing a current ($I_{bit}$, $I_{word}$) through at least one current line.

20. Method according to claim 19, wherein tuning the current or voltage comprises flowing a current ($I_{bit}+I_{comp\_b}$, $I_{word}+I_{comp\_w}$) through the at least one current line, which current ($I_{bit}+I_{comp\_b}$, $I_{word}+I_{comp\_w}$) is different from the current ($I_{bit}$, $I_{word}$) which would flow through the at least one current line when no external magnetic field would be present in order to generate a same programming magnetic field.

* * * * *